(12) United States Patent
Cormier et al.

(10) Patent No.: US 9,990,932 B2
(45) Date of Patent: Jun. 5, 2018

(54) PROCESSING IN THE ENCODED DOMAIN OF AN AUDIO SIGNAL ENCODED BY ADPCM CODING

(75) Inventors: Adrien Cormier, Villedoux (FR); Balazs Kovesi, Lannion (FR); Claude Lamblin, Tregastel (FR)

(73) Assignee: ORANGE, Paris (FR)

( * ) Notice: Subject to any disclaimer, the term of this patent is extended or adjusted under 35 U.S.C. 154(b) by 620 days.

(21) Appl. No.: 14/008,435

(22) PCT Filed: Mar. 27, 2012

(86) PCT No.: PCT/FR2012/050637
§ 371 (c)(1),
(2), (4) Date: Feb. 18, 2014

(87) PCT Pub. No.: WO2012/131247
PCT Pub. Date: Oct. 4, 2012

(65) Prior Publication Data
US 2014/0163998 A1    Jun. 12, 2014

(30) Foreign Application Priority Data

Mar. 29, 2011 (FR) .................... 11 52596

(51) Int. Cl.
*G10L 19/04* (2013.01)
*H03M 3/04* (2006.01)
*G10L 25/90* (2013.01)
*G10L 25/93* (2013.01)

(52) U.S. Cl.
CPC ............. *G10L 19/04* (2013.01); *H03M 3/042* (2013.01); *G10L 25/90* (2013.01); *G10L 25/93* (2013.01)

(58) Field of Classification Search
CPC ...................................................... G10L 19/04
USPC ................................................. 704/500–504
See application file for complete search history.

(56) References Cited

U.S. PATENT DOCUMENTS

| 5,781,888 A * | 7/1998 | Herre ............. G10L 19/012 704/200.1 |
| 6,023,295 A * | 2/2000 | Pau ................ H04N 19/50 375/240.04 |
| 2005/0152557 A1* | 7/2005 | Sasaki ............. H04S 7/302 381/58 |

(Continued)

FOREIGN PATENT DOCUMENTS

WO    2009010831 A1    1/2009

OTHER PUBLICATIONS

International Preliminary Report on Patentability and Written Opinion in English dated Oct. 1, 2013 for corresponding International Patent Application No. PCT/FR2012/050637, filed Mar. 27, 2012, 6 pages.

(Continued)

*Primary Examiner* — Michael N Opsasnick
(74) *Attorney, Agent, or Firm* — David D. Brush; Westman, Champlin & Koehler, P.A.

(57) ABSTRACT

A method for processing an encoded audio signal in a binary stream by MICDA predictive coding. The method includes the following steps: determining a signal assessed from quantification indices of the binary stream; determining unencoded parameters representative of the audio signal from the assessed signal; and processing the encoded audio signal using the determined parameters. Also provided is a device implementing the method.

10 Claims, 4 Drawing Sheets (56) References Cited

U.S. PATENT DOCUMENTS

| | | | |
|---|---|---|---|
| 2007/0100639 A1* | 5/2007 | Den Brinker | G10L 19/032 |
| | | | 704/500 |
| 2008/0046241 A1* | 2/2008 | Osburn | G10L 17/26 |
| | | | 704/250 |
| 2008/0046248 A1* | 2/2008 | Chen | G10L 19/005 |
| | | | 704/262 |
| 2008/0046252 A1* | 2/2008 | Zopf | G10L 19/005 |
| | | | 704/501 |
| 2008/0191417 A1* | 8/2008 | Pham | A63F 1/00 |
| | | | 273/292 |
| 2009/0041021 A1* | 2/2009 | Meany | H03M 7/00 |
| | | | 370/394 |
| 2009/0232228 A1* | 9/2009 | Thyssen | G10L 19/005 |
| | | | 375/242 |

OTHER PUBLICATIONS

International Search Report and Written Opinion dated Jun. 14, 2012 for corresponding International Application No. PCT/FR2012/050637, filed Mar. 27, 2012.

Rafila K. S. et al., "Voice/Unvoiced/Mixed Excitation Classification of Speech Using the Autocorrelation of the Output of an ADCPM System", Aug. 24, 1989; Aug. 24, 1989-Aug. 26, 1989, Aug. 24, 1989 (Aug. 24, 1989), pp. 537-540, XP010088173.

"7 kHz Audio-Coding Within 64 kbit/s; G.722 (Nov. 1988)" ITU-T Standard, International Telecommunication Union, Geneva; CH No. G.722 (Nov. 1988), Nov. 25, 1988 (Nov. 25, 1988), pp. 1-75, XP017460950.

* cited by examiner

PROCESSING IN THE ENCODED DOMAIN OF AN AUDIO SIGNAL ENCODED BY ADPCM CODING

CROSS-REFERENCE TO RELATED APPLICATIONS

This Application is a Section 371 National Stage Application of International Application No. PCT/FR2012/050637, filed Mar. 27, 2012, which is incorporated by reference in its entirety and published as WO 2012/131247 on Oct. 4, 2012, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The present invention pertains to the processing of coded digital signals. These coded signals are intended to sit within applications of transmission or storage of multimedia signals such as audio signals (speech and/or sounds).

The present invention pertains more particularly to signals coded according to an adaptive waveform coding scheme such as ADPCM technology (the initials standing for "Adaptative Differential Pulse Code Modulation").

BACKGROUND OF THE DISCLOSURE

ADPCM technology is a technique for compressing multimedia signals. The best known and most widely used examples of coders using ADPCM technology are two speech coders, standardized at the ITU-T: the ITU-T G.726 coder for signals in the telephone band (or narrow band) sampled at 8 kHz ("Digital Enhanced Cordless Telephone" or DECT coder) and the ITU-T G.722 coder for signals in the broadened band sampled at 16 kHz (HD voice coder for VoIP).

ADPCM coding is a predictive coding where the current sample is predicted by an adaptive predictor of ARMA (for "Auto Regressive Moving Average") type on the basis of the past decoded values. By using the decoded values, the decoder can make the same prediction as the encoder. The adaptation of the predictor is also done on the basis of the decoded values (of the decoded signal and of the decoded prediction error), sample by sample, without additional information transmission.

The ADPCM encoder quantizes the difference between the prediction of the current sample and the actual value of the current sample (the prediction error) by using an adaptive scalar quantizer. The coded amplitude of the prediction error is composed of 2 parts: a constant part stored in ROM memory indexed by the scalar quantization indices and a multiplicative adaptive factor (in the linear domain) called the scale factor, whose adaptation is done without additional information transmission, sample by sample, as a function of the quantization index transmitted. Therefore, in the ADPCM bitstream, only the scalar quantization indices obtained by quantizing the prediction error sample by sample are transmitted. These scalar quantization indices are made up of a sign bit sign(n) and an amplitude quantization index I(n).

To decode the bitstream, the decoder performs a sample by sample inverse quantization of the prediction error using the inverse adaptive quantizer. The decoder also makes the same prediction of the current sample as that performed at the encoder, by using the same ARMA adaptive predictor (in the absence of transmission errors) adapted sample by sample. In the case of transmission errors, the predictor and the quantizer at the decoder diverge from those at the encoder. By virtue of the use of forget factors they generally re-converge in a few milliseconds. The decoded value of the current sample is obtained by adding together the prediction and the dequantized value of the prediction error.

In a transmission chain, in addition to coding and decoding, other signal processing procedures may be performed. It is possible to cite for example: the processings performed in conference bridges for mixing or switching all or part of the incoming streams so as to generate outgoing streams, those performed in conference bridges, gateways or peripherals to conceal lost packets or frames ("PLC: Packet Loss Concealment") or to temporally adjust the signal ("time scaling"), or else the processings in communication servers or gateways to perform discrimination of contents or of voice.

Much of this processing works in the domain of the decoded signal, and this may require a re-encoding after processing. Such is the case, for example, for signals processed in conference bridges (for example mixing bridge) or in certain jitter buffers (e.g. DECT). The compressed frame arrives in a first coding format, it is decompressed, the decoded signal is analyzed to extract the data required for the processing (e.g. intermediate parameters and signals), and then the decoded signal is processed with the analyzed data, and the processed signal is then re-compressed into a format accepted subsequently in the communication chain.

There is therefore a cascading of a decoder and of a coder, commonly called a tandem. This solution is very expensive in terms of complexity (essentially because of the recoding) and it degrades the quality, since the second coding is done on a decoded signal, which is an already degraded version of the original signal, the degradations accumulating. Moreover, a frame may encounter several tandems before arriving at destination. The cost in terms of calculation and the loss of quality induced by such a system are readily imagined. Moreover, the delays related to each tandem operation accumulate and may be detrimental to the interactivity of the communications.

For certain equipment, the cost overhead in terms of memory and complexity to host an encoder and/or a decoder may be prohibitive. It may also happen that the decoder is not built into equipment in which the processing has to be performed, such as for example switching bridges or jitter buffers.

Certain remote decoders are in terminals of low capacity which are not able to perform such processings, this is the case for example for DECT terminals linked to domestic gateways more commonly called Boxes.

To remedy these drawbacks, there exist processing procedures without complete decoding of the signal.

Thus, for processings of error concealment type, there exist very non-complex procedures for concealing errors in the coded domain. Such techniques are for example described in annex A to ITU-T recommendation G.191 for techniques for concealing errors adapted to the G.722 coder. They consist in filling a coded frame either with indices corresponding to a signal set to zero over the whole of the duration of the frame or simply in repeating the bitstream of the previous frame. However, these techniques are of lower quality in comparison to the error concealment techniques described in appendices III and IV of ITU-T standard G.722. In these appendices, it is indeed necessary to analyze the decoded signal to extract diverse information about the signal to be reconstructed such as for example, the presence or the absence of vocal activity, the degree of stationarity of the signal, the nature of the signal, its fundamental period, etc.

This information is, for certain coders, for example, coders employing analysis by synthesis (CELP for "Code Excited Linear Prediction"), estimated at the encoder and coded so as to be transmitted in the bitstream. This is the case for example for the pitch period.

Thus, for this type of coder, it is possible to utilize this coded information to perform a processing in the coded domain. Such is the case for example for the technique described in patent application WO 2009/010831 where a processing in the coded domain of temporal adjustment type is proposed for the CELP analysis-synthesis compression technique.

This type of processing in the coded domain cannot be applied to ADPCM coding techniques, since in contradistinction to CELP technology, the parameters used in these processings are not calculated by the ADPCM encoder and are therefore not present in the ADPCM bitstream.

There therefore exists a need to perform processings of good quality in the coded domain for signals coded by the ADPCM coding technology without requiring decoding, even partial, of the signal.

SUMMARY

An embodiment of the present application relates to a method for processing a coded audio signal in a bitstream by a predictive coding of ADPCM type. The method is noteworthy in that it comprises the following steps:
 determination of an estimated signal on the basis of the quantization indices of the bitstream;
 determination of uncoded parameters representative of said audio signal, on the basis of said estimated signal;
 processing of said coded audio signal using the parameters determined.

Thus, on the basis of the bitstream of ADPCM type, the invention makes it possible to determine an estimated signal on the basis of which the parameters useful for the processing will be determined. It is therefore not necessary to decode the signal to obtain these parameters. This method is therefore of lower complexity and can be performed remotely from the decoder.

Obtaining the processing parameters representative of the signal makes it possible moreover to obtain good quality processings adapted to the signal.

In a particular embodiment, the step of determining an estimated signal comprises the following steps for a current sample:
 obtaining of an adaptation parameter associated with the quantization index for the current sample;
 calculation of the estimated signal for the current sample on the basis of the adaptation parameter determined, of the signal estimated for the previous sample and of a predefined forget factor.

The signal thus estimated is very representative of the signal to be coded. An analysis of this estimated signal suffices to determine uncoded parameters of this signal.

In a particular embodiment, the adaptation parameter is defined in a prior step, in such a way that its value complies with the property of monotonic increase with the quantized amplitude values corresponding to the quantization indices.

In an advantageous embodiment, the adaptation parameter is obtained in real time by simple binary shifting and subtraction on the basis of the quantization index.

Thus, it is not necessary to store the adaptation parameters associated with the quantization indices since they are obtained directly in a simple manner and in real time, from the quantization indices.

In a particular embodiment, the estimated signal is determined according to the equation:

$$se(n)=V*se(n-1)+M(I(n-1))$$

where se(n) represents the signal estimated for the current sample, se(n−1) the estimated signal of the previous sample, M(I(n−1)) the adaptation parameter as a function of the quantization index of the previous sample and V a forget factor with a variable less than 1.

This type of equation makes it possible to obtain an estimated signal which follows the shape of the coded signal.

Thus, the analysis of the estimated signal makes it possible to determine parameters included in a non-exhaustive list comprising:
 the energy of the audio signal;
 the periodicity or otherwise of the audio signal;
 the classification of the audio signal;
 the fundamental period of the audio signal;
 the temporal position of the glottal pulses;
 the vocal activity.

According to different embodiments, the processing of the coded audio signal may be of type:
 discrimination of speakers and in the case of detection of an undesirable voice its reduction to silence in the coded domain;
 detection of vocal inactivity and replacement of the corresponding bitstream by a bitstream obtained by coding of a comfort noise with a weaker level.

These processings are merely nonlimiting examples. Many other types of processings for which parameters of the audio signal may be useful are very obviously also possible.

The invention also pertains to a device for processing a coded audio signal in a bitstream by a predictive coding of ADPCM type, noteworthy in that it comprises:
 a module for determining an estimated signal on the basis of the quantization indices of the bitstream;
 an analysis module for determining uncoded parameters representative of said audio signal, on the basis of said estimated signal;
 a module for processing said coded audio signal using the parameters determined.

It may involve for example a server, a communication gateway or a switching bridge comprising the device described.

The invention pertains to a computer program comprising code instructions for the implementation of the steps of the processing method such as described, when these instructions are executed by a processor.

Finally, the invention pertains to a storage support, readable by a processor, possibly integrated into the processing device, optionally removable, storing a computer program implementing a processing method such as described above.

BRIEF DESCRIPTION OF THE DRAWINGS

Other characteristics and advantages of the invention will be more clearly apparent on reading the following description, given solely by way of nonlimiting example, and offered with reference to the appended drawings in which.

DETAILED DESCRIPTION OF ILLUSTRATIVE EMBODIMENTS

Figure 1:
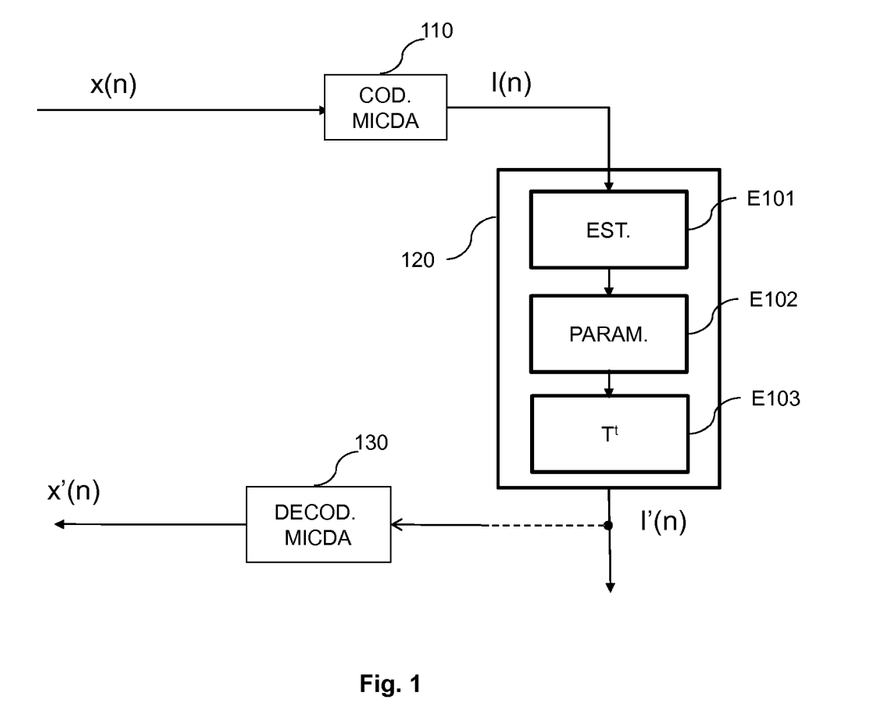
FIG. 1 illustrates an ADPCM coding/decoding chain into which the processing device implementing the processing method according to the invention is inserted.

FIG. 1 thus shows an ADPCM coding/decoding chain into which the invention is inserted.

The input signal x(n) is coded at 110 by an ADPCM coding module as described for example in the ITU-T recommendations G.722 or G.726. At the output of this coding module, quantization indices (sign bit sign(n) and amplitude quantization index I(n)) are obtained sample by sample. By using for example k bits per sample it is possible to code $2^{k-1}$ various amplitudes, I(n) is therefore composed of k−1 bits. Note that in certain coders the coding of the sign bit and of the amplitude bits is done jointly (without making any distinction between sign bit and amplitude bits, such as for example in the ITU-T G.722 coder). In this case the amplitude index I(n) and the sign bit sign(n) can be easily found on the basis of the joint representation, for example by simple reading of a lookup array. In the examples given in this document, for simplicity of notation, we also assume that the quantized amplitude values increase monotonically with the amplitude quantization index (the index 0 corresponds to the smallest amplitude), but the invention naturally applies to the other possible cases also. In these other cases it is for example possible to reorder the values before applying the invention.

The processing device 120 receives as input the amplitude quantization indices I(n).

In a step E101, a module "EST.", implements a step of determining an estimated signal se(n), on the basis of these amplitude quantization indices I(n). For example, the estimated signal is obtained by updating its previous value se(n−1) using an adaptation parameter (M(I(n−1)) which depends on the previous amplitude scalar quantization index (I(n−1)). In this case, for an amplitude quantization index I(n), the module "EST." therefore obtains an adaptation parameter M(I(n)) associated with this index. The adaptation parameter M(I(n)) can be multiplicative or additive.

This adaptation parameter has been defined for example in a prior step and stored in association with the value of the amplitude quantization index in a table. Advantageously, the adaptation parameter increases with the amplitude value associated with the amplitude quantization index. In the case of a multiplicative adaptation parameter, it is less than 1 for the indices corresponding to a low amplitude quantized value and greater than 1 for the indices corresponding to a high amplitude quantized value. In the case of an additive adaptation parameter it is less than 0 for the indices corresponding to a low amplitude quantized value and greater than 0 for the indices corresponding to a high amplitude quantized value.

In an advantageous embodiment, the additive adaptation parameter corresponding to the amplitude quantization index of the previous sample (M(I(n−1))) is added to the value of the previous sample of the estimated signal (se(n−1)) to give the value of the current sample (se(n)). The adaptation parameter deduced from the amplitude quantization index thus represents the variation between the current sample and the previous sample of the estimated signal.

$$se'(n)=se'(n-1)+M(I(n-1)) \quad (1)$$

In an exemplary embodiment where the amplitude quantization index is coded on k−1=3 bits, the following array 1 gives an example of the possible values of this additive adaptation parameter as a function of the quantization index I(n).

| amplitude index I(n) | 0 | 1 | 2 | 3 | 4 | 5 | 6 | 7 |
|---|---|---|---|---|---|---|---|---|
| adaptation parameter M(I(n)) | −3 | −2 | 0 | 4 | 12 | 28 | 60 | 124 |

Array 1: Example of Values of the Additive Adaptation Parameter as a Function of Quantization Index We recall that in the array 1 we assume that the quantized amplitude values increase monotonically with the amplitude quantization index. The values M(I(n)) can very obviously be different provided that they retain the property of monotonic increase with the quantized amplitude values corresponding to the quantization indices and that they comply with the restriction relating to the signs of these values (negative for indices corresponding to a low amplitude quantized value and positive for indices corresponding to a high amplitude quantized value).

It is still more advantageous to choose values M(I(n−1)) in such a way that they can be obtained in real time on the basis of the amplitude quantization index I(n) by simple mathematical operations. Thus the storage of this array is no longer necessary (virtual array) thus decreasing the needs in terms of ROM memory of the device according to the invention. In the case of the array 1 the values of the example given by this array 1 have been obtained through the equation:

$$M(I(n-1))=(1<<I(n-1))-4$$

where << symbolizes left binary shift.

So as to obtain an estimated signal which converges rapidly after for example a possible transmission error, a forget factor is defined so as to weight the estimated signal of the previous sample. This forget factor is a variable, in general with a value of less than one and may for example be chosen to have a value of 0.99.

In one embodiment of the invention, the estimated signal is then calculated at E101 according to the following equation:

$$se(n)=0.99*se(n-1)+M(I(n-1)) \quad (2)$$

se(n) representing the signal estimated for the current sample, se(n−1) the estimated signal of the previous sample, M(I(n−1)) being the additive adaptation parameter for the quantization index of the previous sample.

A quasi-equivalent exemplary realization of a multiplicative adaptation factor $M_m(I(n-1))$ with forget factor for calculating the estimated signal $se_m(n)$ is given by equation (3):

$$se_m(n) = se_m(n-1)^{0.99} * M_m(I(n-1)) \quad (3)$$

where the values of the multiplicative adaptation parameters $M_m(I(n-1))$ should advantageously comply with the constraints already mentioned: they are less than 1 for indices corresponding to a low amplitude quantized value and greater than 1 for indices corresponding to a high amplitude quantized value. Moreover, they increase monotonically.

The properties of the estimated signals $se(n)$ and $se_m(n)$ obtained according to equations 2 and 3 are equivalent. It is noted that the calculational complexity of equation (3) is greater than that of equation 2, this is why in the favored realization of the invention the additive adaptation parameters are used. Subsequently in this document we always consider the estimated signal $se(n)$ obtained by using additive adaptation parameters, but the remarks are also valid for the estimated signal $se_m(n)$ obtained by using multiplicative adaptation parameters.

The estimated signal $se(n)$ according to the invention has characteristics similar to those of the representation of the decoded scale factor of a coder of G. 722 type but unlike with the latter, this is not a decoded signal but a signal deduced in a simple manner from the ADPCM bitstream thus avoiding expensive operations in terms of complexity such as for example verification of saturation of the values. Indeed, to implement the present invention there is no need to limit the use of the bounded values represented on 16 bits, the amplitude of the estimated signal $se(n)$ not being limited.

For a coder of G.722 type, two prediction errors are coded and transmitted in the bitstream: the first which uses 4, 5, or 6 bits is intended to represent the prediction error of the low band (from 0 to 4000 Hz). The second prediction error, intended for the high band (from 4000 Hz to 8000 Hz), is always coded on 2 bits.

Thus in the low band of a coder of G.722 type, the prediction error is coded on 4, 5 or 6 bits as a function of the total bitrate (48, 56 or 64 kbit/s respectively). In order for the coder and the decoder to remain synchronized, they must use the same scale factor. The G.722 being a scalable coder, the bitrate can be reduced during the transmission. This is why the encoder must consider that only the lowest bitrate will be available at the decoder. For these reasons, in the G.722 coder and the decoder the adaptation of the scale factor must be done on the basis of the indices of the lowest bitrate (48 kbit/s, including 32 kbit/s for the low band, i.e. 4 bits per sample of the low band, composed of a sign bit and of 3 bits to choose from among the 8 possible amplitudes of the scalar quantizer).

The estimated signal $se(n)$ according to the invention is calculated neither at the encoder nor at the decoder but between the two, therefore without any synchronization constraint. Thus, by virtue of the device, the estimated signal $se(n)$ can be calculated by using all the available bits. In the example of a low band G.722 bitstream it is possible to use 3, 4 or 5 bits for the amplitude index $I(n)$ as a function of the current coding bitrate (48, 56 or 64 kbit/s respectively) to ensure better precision of the estimated signal $se(n)$. Conversely, it is also possible to use only high-order bits of the low band, for example 3 out of the 5 received. Thus the device according to the present invention makes it possible to choose in a flexible manner the best compromise between quality and complexity as a function of the constraints of the application aimed at. Subsequently we consider for the simplicity of the examples given that the amplitude quantization index $I(n)$ used by the device is coded on 3 bits. However, the invention also covers the higher bitrates such as for example the G.722 coding at 56 kbits/s, where 16 possible amplitudes in the low band are coded on 4 bits (+1 sign bit) or at its bitrate of 64 kbit/s, using 5 bits to represent the amplitude of its quantizer (32 possible levels).

In the examples of this document we denote $I(n)$ the index on 3 bits to code the amplitudes $y(I(n))$ which are ordered according to their increasing values.

The estimated signal $se(n)$ according to the invention (such as for example the signal $se(n)$ according to equation 2) approximately follows the temporal envelope of the signal to be coded. Indeed the energy of the prediction error coded by a PCM coder is lower than that of the signal to be coded or of the decoded signal (these latter 2 have nearly the same energy). The ratio between the energy of the PCM prediction error and that of the decoded signal depends on the prediction gain: for a very predictive signal which varies slowly the prediction gain is high and the energy of the prediction error is low.

In the non-predictive zones (such as for example the moment of opening of the glottis for the signal from speech, a percussion, or the plucking of a string in music) the prediction gain is low, and is close to unity. The energy of the prediction error is then comparable with that of the signal to be coded. As predictive and non-predictive zones vary regularly in natural signals, the temporal envelope of the prediction error (adjusted to the large values of the non-predictive zones) is nearly proportional with that of the signal to be coded. For the parts with high energy the quantization of the prediction error more often requires the highest levels of the quantizer, and according to array 1 and equation 2 the value of the estimated signal $se(n)$ increases greatly in these zones. Conversely, for the parts of silence or of low background noise which are very predictive it is rather the lowest levels of the quantizer which will be used, the value of the estimated signal $se(n)$ then decreasing. Thus the estimated signal $se(n)$ according to the invention approximately follows the shape of the coded signal, and makes it possible to differentiate the active zones from noise. Moreover, for a voiced speech signal the periodic opening of the glottis introduces non-predictive zones in a periodic manner thereby causing periodic increases in the estimated signal $se(n)$ therefore by analyzing the value of the estimated signal $se(n)$, a large increase is noted, corresponding to the moments of opening of the glottis.

The estimated signal $se(n)$ is therefore sufficient to detect several uncoded characteristics of the signal.

Figure 2:
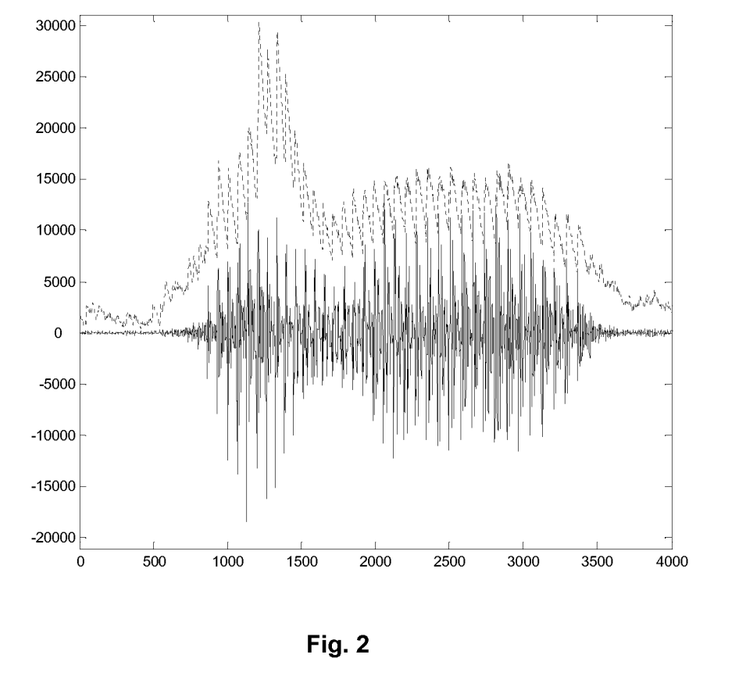
FIG. 2 illustrates a comparison between the estimated signal and the uncoded audio signal thus showing the possibilities of obtaining processing parameters adapted to the signal, according to the invention.

Indeed, when comparing this estimated signal and the audio signal to be coded in FIG. 2, it may be seen that on the basis of this estimated signal, it is possible to determine parameters specific to the audio signal and which have not been coded by the ADPCM coding, such as for example, its energy or its long-term periodicity. In this figure the continuous line represents the signal to be coded, the dashed line represents the estimated signal $se(n)$ obtained by using array 1 and equation 2, scaled ($30*se(n)$) to facilitate comparison of the two curves.

Figure 3:
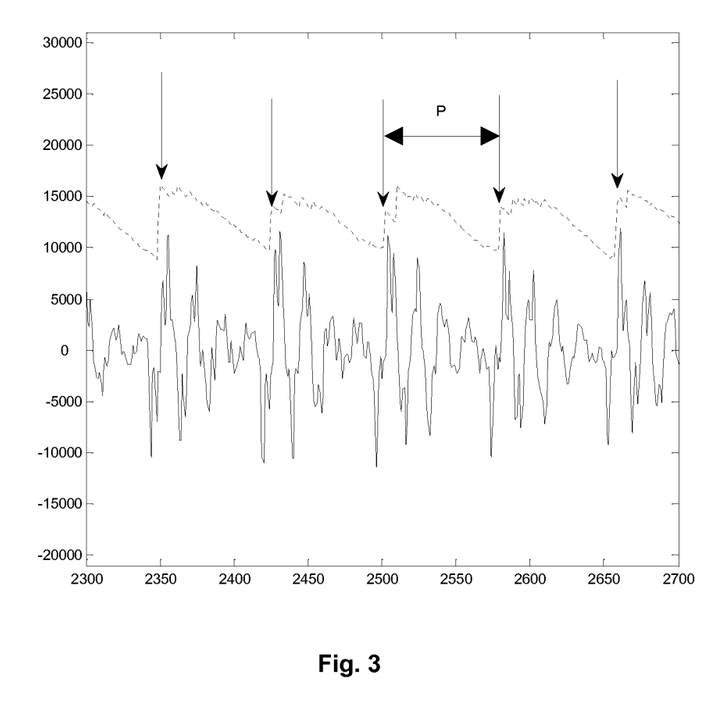
FIG. 3 illustrates a magnified part of FIG. 2 showing a representation of processing parameters that can be determined on the basis of the signal estimated according to the invention.

FIG. 3 magnifies the zone of the temporal indices 2300 to 2700 of FIG. 2.

In this figure the arrows mark the moments of opening of the glottis (moments of sudden increases in the value of the estimated signal), the distance between 2 arrows gives the current pitch of the signal, period by period. An example marked by 'P' in the figure is also given. The fundamental period (pitch) of the signal can also be determined for a signal zone for example by calculating the autocorrelation function of the estimated signal and by searching for its maximum.

The determination of this estimated signal is of reduced complexity since it relies on simple operations of reading tables, of multiplication and of addition per sample, according to formula (2) defined above. According to the recommendation of the ITU-T G.191 annex A indicating the costs of the operations implemented on the target processors, the operations required for the implementation of this system are composed, per sample, of only two memory accesses and of an MAC (multiplication followed directly by an addition, the latter is often implemented as a base operation in recent processors).

To return to FIG. 1, step E102 determines by the analysis module "PARAM.", the parameters representative of the coded signal, on the basis of this estimated signal.

The analysis of this estimated signal makes it possible to obtain information of several types about the coded signal such as for example:
- an estimation of the energy of the signal;
- an estimation of vocal activity;
- a classification of the signal between voiced and unvoiced signal;
- a detection of the transitions between voiced and unvoiced signal;
- an estimation of the periodicity of the voiced signal (fundamental period or pitch);
- an estimation of the positions of the glottal pulses.

The speed of variation of the energy of the signal and the frequency of the non-active periods (silence) also gives information about the nature of the coded signal (for example speech or music).

This list is not exhaustive and may be supplemented as a function of the processings envisaged on the coded signal.

As a function of the processing which is done in step E103 by the processing module "T", the parameters to be determined at E102 are not the same.

For a processing of content or voice discrimination type the long-term periodicity parameters, "of pitch" or indeed of classification of the signal may be useful.

In an Internet voice discussions forum system reserved for children, an estimation of the periodicity of the so-called "pitch" voice signal in the coded domain could turn out to be beneficial for alerting in regard to the logging on of a party whose "pitch" does not correspond to that of a child. Thus, by using the periodicity parameter obtained on the basis of the estimated signal, the processing device according to the invention can discriminate the voice of a child from that of an adult. The detection of an a priori adult party could thus upload an alert to the moderator who will be able to decide regarding barring of the intruder or an automatic processing will be able to reduce to silence the undesirable voice in the coded domain by replacing the corresponding bitstream by a bitstream that is obtained by coding the silence. The use of the system to determine the kind of voice used by the party will exhibit a consequent saving in complexity, since it will no longer require the decoding of all the streams arriving at the moderator so as to perform a pitch analysis.

In another system the analysis of the long-term periodicity of the estimated signal will make it possible to detect the type of content (speech or music) and will be able to propose automatic adjustment of the volume of the signal in the coded domain so as to avoid the addition of delay or a degradation in the communication that are due to the use of a tandem (decoding of the signal, modification of its content in the coded domain and then re-encoding of the modified signal).

In another system, in case of detection of vocal inactivity, it will be possible to reduce to silence the decoded signal directly from the coded domain by replacing the corresponding bitstream by a bitstream that is obtained by coding the silence. In another variant, in case of detection of vocal inactivity, it will be possible to replace the decoded signal by a comfort noise by replacing the corresponding bitstream by a bitstream that is obtained by coding the desired noise for example with a weaker level.

On completion of step E103, the processed bitstream I'(n) is dispatched as output from the processing device 120 to an ADPCM decoder 130 which does not need to perform additional processings (such as for example the replacing of a voice by silence). This decoder can then operate independently and decodes the bitstream in a conventional manner without being informed of the processing, if any, performed by the device.

At the output of this decoder 130, the decoded signal x'(n) is obtained.

Figure 4:
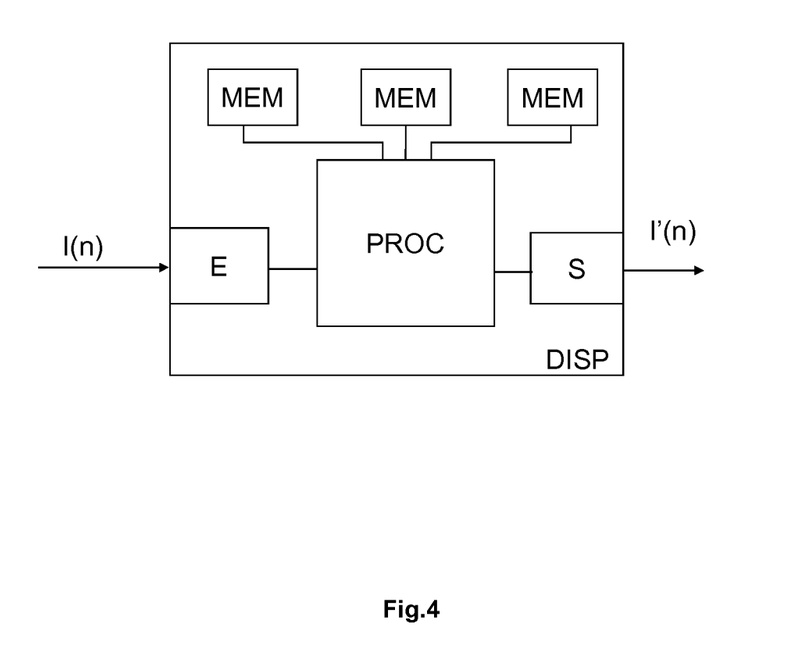
FIG. 4 illustrates a particular hardware configuration of a processing device or a system suitable for an implementation of the method according to the invention.

With reference to FIG. 4 is described a hardware device adapted for embodying a processing device according to one embodiment of the present invention.

This device DISP has the architecture of a conventional computer or else an architecture of a communication server or a gateway for example.

It comprises an input E for receiving a digital signal coded in bitstream form I(n).

The device also comprises a digital signals processor PROC adapted for carrying out processing operations on the bitstream received.

This processor is linked to one or more memory units MEM adapted for storing information required for controlling the device for the processing. For example, these memory units comprise instructions for the implementation of the processing method described hereinabove and notably for implementing the steps of determining an estimated signal on the basis of the quantization indices of the bitstream, of determining uncoded parameters representative of said audio signal, on the basis of said estimated signal and of processing said coded audio signal using the parameters determined.

These memory units can also comprise tables of quantization values, tables of adaptation parameters or other calculation parameters required for the implementation of the processing method.

In a more general manner, a storage means, readable by a processor, possibly integrated into the processing device, optionally removable, stores a computer program implementing a processing method according to the invention. The block 120 of FIG. 1 can for example illustrate the algorithm of such a computer program.

The processor is also adapted for storing results in these memory units. Finally, the device comprises an output S linked to the processor for providing an output signal in the form of a processed bitstream I'(n).

The invention claimed is:

1. A method for processing a coded audio signal, coded as a bitstream by a predictive coding of ADPCM type, wherein the method comprises the following acts performed by an audio signal processing device:
   - receiving a bitstream of a coded audio signal from a coding device of ADPCM type that has coded the audio signal into the bitstream;
   - generating by the audio signal processing device an estimated signal on the basis of quantization indices of the bitstream, the generating being carried out for a current sample by:

obtaining an adaptation parameter associated with the quantization index for a previous sample; and calculating the estimated signal for the current sample on the basis of the adaptation parameter obtained, of the signal estimated for the previous sample and of a predefined forget factor;

generating by the audio signal processing device uncoded parameters representative of said audio signal, on the basis of said estimated signal;

processing said coded audio signal by the processing device, comprising modifying at least one zone of the coded audio signal using the uncoded parameters to produce a processed bitstream, without decoding the coded audio signal; and outputting the processed bit stream to a decoding device.

2. The method as claimed in claim 1, wherein the adaptation parameter is defined in a prior act, in such a way that its value complies with the property of monotonic increase with the quantized amplitude values corresponding to the quantization indices.

3. The method as claimed in claim 1, wherein the adaptation parameter is obtained in real time by simple binary shifting and subtraction on the basis of the quantization index.

4. The method as claimed in claim 2, wherein the estimated signal is generated according to the equation:

$$se(n)=V*se(n-1)+M(I(n-1))$$

where se (n) represents the signal estimated for the current sample, se(n−1) the estimated signal of the previous sample, M(I(n−1)) the adaptation parameter as a function of the quantization index of the previous sample and V a forget factor with a variable less than 1.

5. The method as claimed in claim 1, wherein the uncoded parameters are generated on the basis of the signal estimated by an analysis step and form part of parameters belonging to the group consisting of:

the energy of the audio signal;
the periodicity or otherwise of the audio signal;
the classification of the audio signal;
the length of the fundamental period of the audio signal;
the temporal position of the glottal pulses;
the vocal activity.

6. The method as claimed in claim 1, wherein the processing of the coded audio signal comprises an analysis of a periodicity parameter obtained from the estimated signal for discriminating voice of speakers generating the audio signal and in the case of detection of an undesirable voices the modifying comprises reducing the undesirable voice to silence in the coded domain.

7. The method as claimed in claim 1, wherein the processing of the coded audio signal comprises a detection of vocal inactivity and the modifying comprises replacement of a corresponding zone of the bitstream by a bitstream obtained by coding of a comfort noise.

8. A device for processing a coded audio signal, coded as a bitstream by a predictive coding of ADPCM type, wherein the device comprises:

an input receiving a bitstream of a coded audio signal from a coding device of ADPCM type that has coded the audio signal into the bitstream;

a module configured to generate an estimated signal on the basis of quantization indices of the bitstream, by implementing the following acts, for a current sample:

obtaining an adaptation parameter associated with the quantization index for the previous sample; and calculation of the estimated signal for the current sample on the basis of the adaptation parameter obtained, of the signal estimated for the previous sample and of a predefined forget factor;

an analysis module configured to generate uncoded parameters representative of said audio signal, on the basis of said estimated signal; and a module configured to process said coded audio signal, comprising modifying at least one zone of the coded audio signal using the uncoded parameters to produce a processed bit stream without decoding the coded audio signal; and an output providing the processed bitstream to a decoding device.

9. A communication gateway comprising the device for processing as claimed in claim 8.

10. A storage device comprising a computer program stored thereon and comprising code instructions for implementation of acts of a method for processing a coded audio signal, coded as a bitstream by a predictive coding of ADPCM type, when these instructions are executed by a processor, wherein the method comprises the following acts:

receiving a bitstream of a coded audio signal from a coding device of ADPCM type that has coded the audio signal into the bitstream;

generating an estimated signal on the basis of quantization indices of the bitstream, the generating being carried out for a current sample by:

obtaining an adaptation parameter associated with the quantization index for a previous sample; and calculating the estimated signal for the current sample on the basis of the adaptation parameter obtained, of the signal estimated for the previous sample and of a predefined forget factor;

generating uncoded parameters representative of said audio signal, on the basis of said estimated signal;

processing said coded audio signal by the processing device, comprising modifying at least one zone of the coded audio signal using the uncoded parameters to produce a processed bitstream without decoding the coded audio signal; and outputting the processed bit stream to a decoding device.

* * * * *

UNITED STATES PATENT AND TRADEMARK OFFICE
CERTIFICATE OF CORRECTION

Page 1 of 1

PATENT NO.         : 9,990,932 B2
APPLICATION NO.    : 14/008435
DATED              : June 5, 2018
INVENTOR(S)        : Adrien Cormier et al.

It is certified that error appears in the above-identified patent and that said Letters Patent is hereby corrected as shown below:

In the Claims

In Claim 6, Column 11, Line 48, delete "voices" and insert --voice--

Signed and Sealed this
Nineteenth Day of March, 2019

Andrei Iancu
*Director of the United States Patent and Trademark Office*